US012755769B2

(12) United States Patent
Lim et al.

(10) Patent No.: US 12,755,769 B2
(45) Date of Patent: *Oct. 6, 2026

(54) METHODS AND APPARATUS INCLUDING SAMPLER CIRCUITRY FOR PERFORMING OFFEST CALIBRATION

(71) Applicant: SAMSUNG ELECTRONICS CO., LTD., Suwon-si (KR)

(72) Inventors: Baek Jin Lim, Suwon-si (KR); Youngchul Cho, Gyeonggi-do (KR); Seungjin Park, Suwon-si (KR); Doobock Lee, Gyeonggi-do (KR); Youngdon Choi, Seoul (KR); Junghwan Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/794,825

(22) Filed: Aug. 5, 2024

(65) Prior Publication Data

US 2024/0395298 A1 Nov. 28, 2024

Related U.S. Application Data

(63) Continuation of application No. 17/939,016, filed on Sep. 7, 2022, now Pat. No. 12,080,379.

(30) Foreign Application Priority Data

Jan. 13, 2022 (KR) ........................ 10-2022-0005468
Apr. 20, 2022 (KR) ........................ 10-2022-0049002

(51) Int. Cl.
*G11C 7/22* (2006.01)
*G11C 7/06* (2006.01)
*G11C 7/10* (2006.01)

(52) U.S. Cl.
CPC ................ *G11C 7/222* (2013.01); *G11C 7/06* (2013.01); *G11C 7/1096* (2013.01)

(58) Field of Classification Search
CPC .......... G11C 7/222; G11C 7/06; G11C 7/1096
(Continued)

(56) References Cited

U.S. PATENT DOCUMENTS 5,930,689 A * 7/1999 Wilhite ............. H03K 5/15033 455/271
6,819,117 B2 11/2004 Wilsher
(Continued)

FOREIGN PATENT DOCUMENTS

KR 20060042125 5/2006
KR 20170022653 3/2017

*Primary Examiner* — Amir Zarabian
*Assistant Examiner* — Daniel John King
(74) *Attorney, Agent, or Firm* — Fish & Richardson P.C.

(57) ABSTRACT

A semiconductor device according to an embodiment includes a plurality of sampler circuits configured to receive a plurality of offset clock signals or a plurality of divided clock signals and to sample a data signal in response to each of a plurality of divided clock signals. A calibration circuit applies a first offset clock signal to a first sampler circuit, applies a second offset clock signal having an opposite phase to the first offset clock signal to a second sampler circuit, and generates a first offset adjustment signal for adjusting an offset of the first sampler circuit based on an output of the first sampler circuit that is output in response to the first offset clock signal.

20 Claims, 12 Drawing Sheets

(58) Field of Classification Search
USPC .......................................................... 365/207
See application file for complete search history.

(56) References Cited

U.S. PATENT DOCUMENTS

| | | | | |
|---|---|---|---|---|
| 7,057,460 | B2 | 6/2006 | Kaviani et al. | |
| 7,142,047 | B2 | 11/2006 | Sahandiesfanjani et al. | |
| 7,295,605 | B2 | 11/2007 | Gai et al. | |
| 7,710,180 | B1 | 5/2010 | Lai et al. | |
| 8,199,866 | B2 * | 6/2012 | Fuller | H03F 3/45179 375/355 |
| 9,589,605 | B1 | 3/2017 | Kim et al. | |
| 10,033,392 | B2 * | 7/2018 | Im | H04L 7/048 |
| 2005/0185710 | A1 | 8/2005 | Gai et al. | |
| 2015/0312060 | A1 | 10/2015 | Sinha | |
| 2015/0358005 | A1 | 12/2015 | Chen et al. | |
| 2023/0223060 | A1 * | 7/2023 | Lim | G11C 7/06 365/207 |
| 2024/0029768 | A1 * | 1/2024 | Go | G11C 7/222 |

* cited by examiner

400

900

METHODS AND APPARATUS INCLUDING SAMPLER CIRCUITRY FOR PERFORMING OFFEST CALIBRATION

CROSS-REFERENCE TO RELATED APPLICATIONS

This application is a continuation of U.S. application Ser. No. 17/939,016, filed on Sep. 7, 2022, which claims priority to and the benefit of Korean Patent Application No. 10-2022-0005468 filed in the Korean Intellectual Property Office on Jan. 13, 2022, and Korean Patent Application No. 10-2022-0049002 filed in the Korean Intellectual Property Office on Apr. 20, 2022, the entire contents of each are incorporated herein by reference.

BACKGROUND

(a) Field

The present disclosure relates to a semiconductor device.

(b) Description of the Related Art

As a semiconductor device is designed to operate at low power, a receiving circuit of the semiconductor device must accurately process input data signals having a small amplitude. The receiving circuit includes a sampler circuit for amplifying the input data signal. However, it is difficult for the sampler circuit to detect a fine signal due to an offset caused by a process skew or a mismatch between transistors of the sampler circuit. Accordingly, the sampler circuit includes an offset adjustment circuit that compensates for the offset of the sampler circuit.

SUMMARY

An embodiment is to provide a semiconductor device that may cancel a kick-back noise in the offset calibration operation of the sampler circuit.

An embodiment is to provide a semiconductor device that may apply an accurate offset voltage to the sampler circuit.

A semiconductor device according to an embodiment includes: a plurality of sampler circuits configured to receive a plurality of offset clock signals or a plurality of divided clock signals and to sample a data signal in response to each of a plurality of divided clock signals; and a calibration circuit configured to apply a first offset clock signal among a plurality of offset clock signals to a first sampler circuit among a plurality of sampler circuits, to apply a second offset clock signal having an opposite phase to the first offset clock signal among a plurality of offset clock signals to a second sampler circuit among a plurality of sampler circuits, and to generate a first offset adjustment signal for adjusting an offset of the first sampler circuit based on an output of the first sampler circuit output in response to the first offset clock signal.

A semiconductor memory device according to an embodiment includes: a memory cell array including a plurality of memory cells; a clock control circuit configured to receive a data clock signal and divides the data clock signal to generate a plurality of divided clock signals; a plurality of sampler circuits configured to receive the data signal and to sample the data signal in synchronization with a plurality of divided clock signals; a sense amplifier configured to write the sampled data signal to a plurality of memory cells; and a calibration circuit configured to apply a plurality of offset clock signals having an opposite phase to each other to a plurality of sampler circuits to perform offset calibration of a plurality of sampler circuits based on the output of a plurality of sampler circuits generated in synchronization with a plurality of offset clock signals.

An offset calibration method according to an embodiment may include: applying a first voltage and a second voltage to two input terminals of a first amplifier and two input terminals of a second amplifier different from the first amplifier; applying a first clock signal to a clock input terminal of the first amplifier, and applying a second clock signal having a phase opposite to that of the first clock signal to a clock input terminal of the second amplifier; and performing offset calibration of the first amplifier by using the voltage output from the output terminal of the first amplifier to generate a first offset adjustment signal that adjusts the offset of the first amplifier while applying the first clock signal and the second clock signal.

A receiver according to an embodiment includes: a plurality of sampler circuits each including an offset adjustment circuit configured to receive an offset adjustment signal and outputs an offset voltage, and an amplifier that senses and to amplify a data signal input to an input terminal and to be output to an output terminal to which an offset voltage is applied; and a calibration circuit configured to apply a second clock signal having an opposite phase to a first clock signal to an amplifier of a second sampler circuit of a plurality of sampler circuits while applying a first clock signal to an amplifier of a first sampler circuit among a plurality of sampler circuits, and to generate an offset adjustment signal of a first sampler circuit based on an output in an output terminal of the amplifier of the first sampler circuit.

DETAILED DESCRIPTION OF THE EMBODIMENTS

Figure 1:
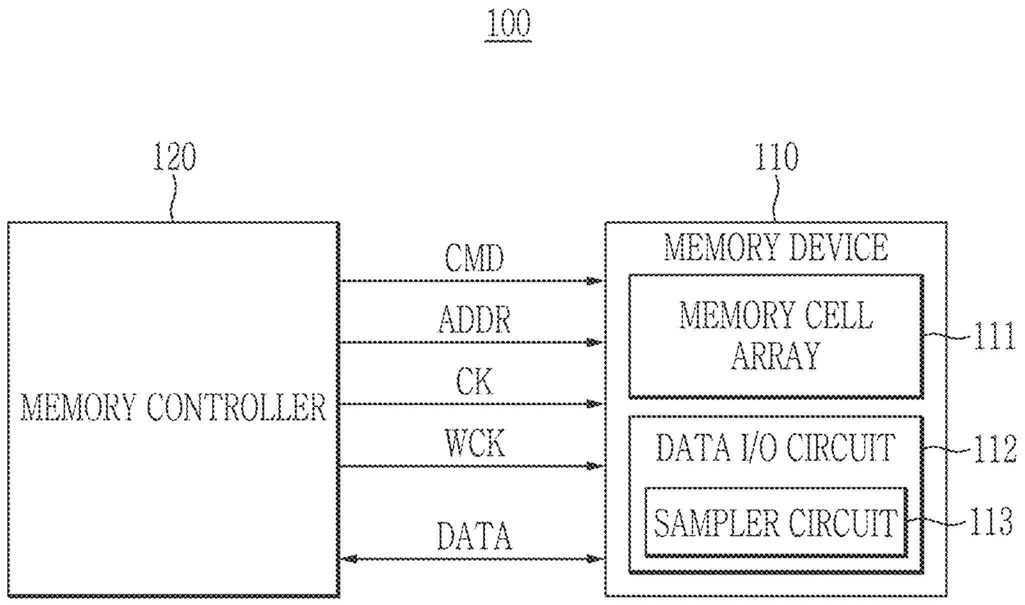
FIG. 1 is a block diagram of a memory system according to an exemplary embodiment.

FIG. 1 is a block diagram of a memory system according to an embodiment.

Referring to FIG. 1, a memory system 100 includes a memory device 110 and a memory controller 120. In some embodiments, the memory device 110 and the memory controller 120 may be connected through a memory interface to send and receive signals through the memory interface.

The memory device 110 includes a memory cell array 111 and a data input/output (I/O) circuit 112. The memory cell array 111 includes a plurality of memory cells connected in a plurality of rows and a plurality of columns. In some embodiments, the rows may be defined by a word line and the columns may be defined by a bit line. The data I/O circuit 112 stores data DATA transmitted from the outside to the memory cell array 111 or outputs the data DATA stored in the memory cell array 111 to the memory device 110 outside (i.e., a memory controller 120, etc.).

In an embodiment, the data I/O circuit 112 may amplify the data DATA using a sampler circuit 113. The data I/O circuit 112 may perform offset calibration so that the data DATA may be accurately amplified. The data I/O circuit 112 may perform the offset calibration by simultaneously providing the clock signals of opposite phases to the sampler circuit 113. In some embodiments, the data I/O circuit 112 may generate the clock signals of the opposite phases using the internal clock signal of the memory device 110. For example, the data I/O circuit 112 may generate a first internal clock signal and a second internal clock signal having the opposite phases to be provided to the sampler circuit 113. As another example, the data I/O circuit 112 may divide the internal clock signal to be provided to the sampler circuit 113 as the clock signals of the opposite phases.

The memory controller 120 controls the memory operation of the memory device 110 by providing a signal to the memory device 110. The signal may include an instruction CMD and an address ADDR. In some embodiments, the memory controller 120 may provide the instruction CMD and the address ADDR to the memory device 110 to access the memory cell array 111 and to control memory operations such as reading or writing. According to a reading operation, the data may be transferred from the memory cell array 111 to the memory controller 120, and the data may be transferred from the memory controller 120 to the memory cell array 111 according to a writing operation.

The instruction CMD may include an activation instruction, a reading/writing instruction, and a refresh instruction. In some embodiments, the instruction CMD may further include a precharge instruction. The activation instruction may be an instruction for switching a target row of the memory cell array 111 to an active state to write the data to or read the data from the memory cell array 111. The memory cell of the target row may be activated (e.g., driven) in response to the activation instruction. The reading/writing instruction may be an instruction for performing a reading operation or a writing operation on the target memory cell of the row converted to the active state. In some embodiments, the read instruction may be an instruction that activates emphasis driving. The refresh instruction may be an instruction for performing a refresh operation in the memory cell array 111.

The memory controller 120 applies a system clock CK and a data clock WCK to the memory device 110 to control the data input/output. The system clock CK may be provided in a form of differential signals with complementary phases to each other. In addition, the data clock WCK may also be provided in a form of differential signals having complementary phases to each other. The system clock CK is a clock related to a transmission rate of the instruction CMD or the address ADDR applied to perform the data input/output operation. On the other hand, the data clock WCK is a clock related to the input/output rate of the data DATA. In some embodiments, a command CMD and an address signal ADDR are transmitted based on the system clock signals CK and CKB. The data DATA is transmitted based on the data clock signal WCK.

In some embodiments, the memory controller 120 may access the memory device 110 according to a request from a host of the memory system 100 outside. The memory controller 120 may communicate with the host using various protocols.

The memory device 110 may be a storage device based on a semiconductor element. In some embodiments, the memory device 110 may include a dynamic random-access memory (DRAM) device. In some embodiments, the memory device 110 may include another volatile or non-volatile memory device in which the sense amplifier 113 is used.

Figure 2:
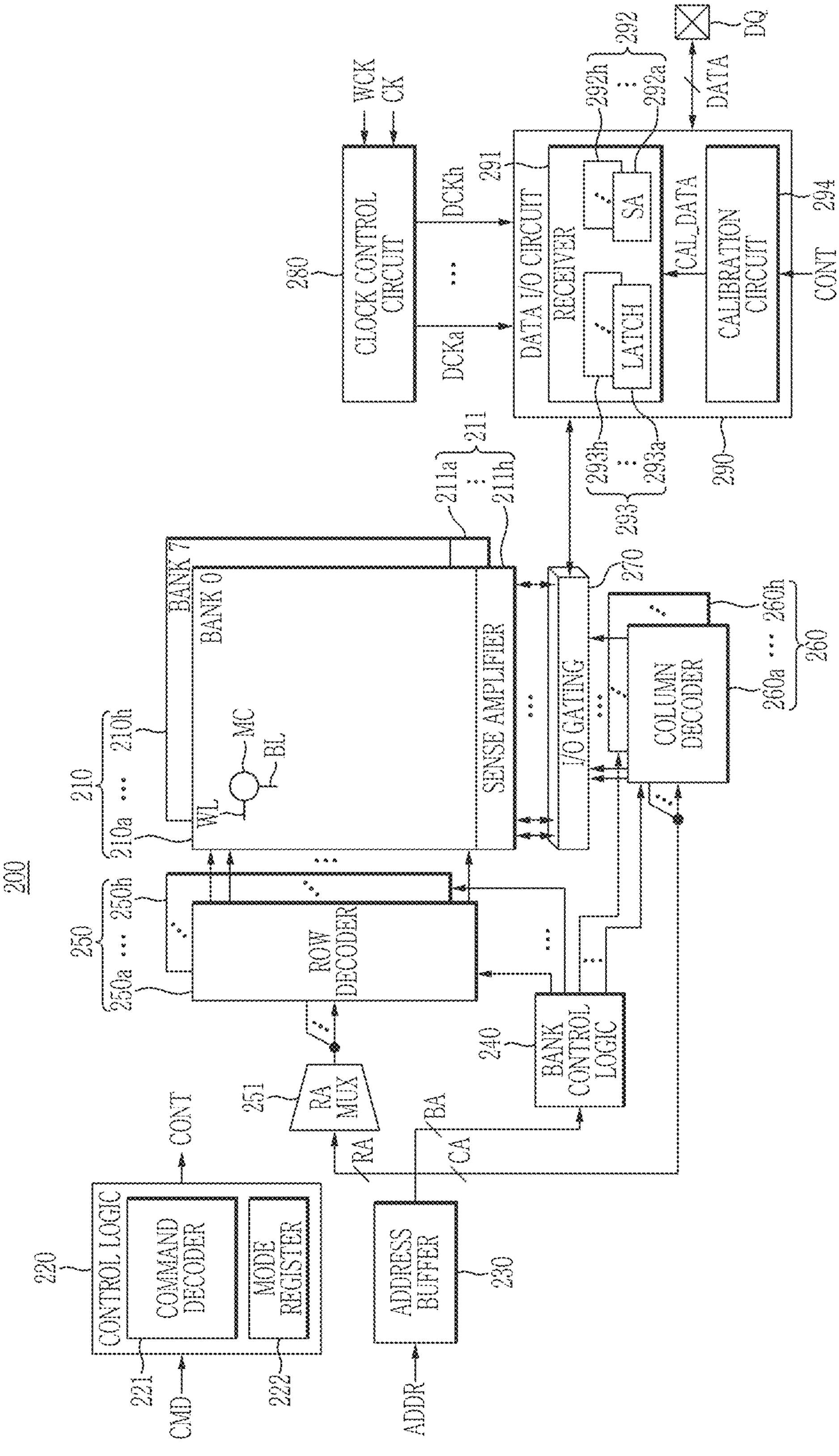
FIG. 2 is a block diagram showing a semiconductor memory device according to an embodiment.

FIG. 2 is a block diagram showing a semiconductor memory device according to an embodiment.

Referring to FIG. 2, a memory device 200 includes a memory cell array 210, a sense amplifier 211, a control logic circuit 220, an address buffer 230, a row decoder 250, a column decoder 260, an I/O gating circuit 270, a clock control circuit 280, and a data I/O circuit 290.

The memory cell array 210 includes a plurality of memory cells MC. In some embodiments, the memory cell array 210 may include a plurality of memory banks 210*a* to 210*h*. FIG. 2 shows eight memory banks BANK0 to BANK7 and 210*a* to 210*h*, but the number of memory banks is not limited thereto. Each of the memory banks 210*a* to 210*h* may include a plurality of rows, a plurality of columns, and a plurality of memory cells MC arranged on the intersection of a plurality of rows and a plurality of columns. In some embodiments, a plurality of rows may be defined by a plurality of word lines WL, and a plurality of columns may be defined by a plurality of bit lines BL.

The control logic circuit 220 controls the operation of the memory device 200. For example, the control logic circuit 220 may generate a control signal CONT so that the memory device 200 performs a read operation, a write operation, an offset calibration operation, and the like. In some embodiments, the control logic circuit 220 may include an instruction decoder 221. The instruction decoder 221 may generate a control signal CONT by decoding the instruction CMD received from a memory controller (e.g., 120 of FIG. 1). In some embodiments, the control logic circuit 220 may further include a mode register 222 for setting the operation mode of the memory device 200.

The address buffer 230 receives the address ADDR provided from the memory controller 120. The address ADDR includes a row address RA indicating the row of the memory cell array 210 and a column address CA indicating the column thereof. The row address RA is provided to the row decoder 250, and the column address CA is provided to the column decoder 260. The row address RA may also be provided to a refresh control circuit (not shown). In some embodiments, the row address RA may be provided to the row decoder 250 through a row address multiplexer 251. In some embodiments, the address ADDR may further include a bank address BA pointing to a memory bank. The bank address BA may be provided by a bank control logic 240.

In some embodiments, the bank control logic 240 may generate a bank control signal in response to the bank address BA. In response to the bank control signal, the bank control logic 240 may activate the row decoder 250 corresponding to the bank address BA among a plurality of row decoders 250 and activate the column decoder 260 corresponding to the bank address BA among a plurality of column decoders 260.

The row decoder 250 selects a row to be activated from a plurality of rows of the memory cell array 210 based on the row address. To this end, the row decoder 250 may apply a driving voltage to the word line corresponding to the row to be activated. In some embodiments, a plurality of row decoders 250*a* to 250*h* corresponding to a plurality of memory banks 210*a* to 210*h* may be provided.

The column decoder 260 selects the column to be activated from among a plurality of columns of the memory cell array 210 based on the column address. To this end, the column decoder 260 may activate the sense amplifier 211 corresponding to the column address CA through the I/O gating circuit 270. In some embodiments, a plurality of column decoders 260*a* to 260*h* respectively corresponding to the plurality of memory banks 210*a* to 210*h* may be provided. In some embodiments, the I/O gating circuit 270 gates input/output data and may include a data latch for storing the data read from the memory cell array 210 and a write driver for writing the data to the memory cell array 210. The data read from the memory cell array 210 may be sensed by the sense amplifier 211 and stored in an I/O gating circuit 270 (e.g., a data latch). In some embodiments, a plurality of sense amplifiers 211*a*-211*h* corresponding to the plurality of memory banks 210*a* to 210*h*, respectively, may be provided.

In some embodiments, the data read from the memory cell array 210 (e.g., the data stored in the data latch) may be provided to the memory controller 120 through the data I/O circuit 290. The data to be written into the memory cell array 210 may be provided from the memory controller 120 to the data I/O circuit 290, and the data provided to the data I/O circuit 290 may be provided to the I/O gating circuit 270.

The clock control circuit 280 may receive the system clock CK and the data clock WCK. The clock control circuit 280 may generate divided clock signals DCKa, . . . , DCKh having a plurality of phases using the system clock CK and the data clock WCK. In some embodiments, the clock control circuit 280 divides the data clock WCK by using the system clock CK, thereby the clock signals DCKa, . . . , DCKh may be generated. In addition, the clock control circuit 280 may generate an internal clock signal by using the system clock CK.

The data I/O circuit 290 includes a receiver 291 and a calibration circuit 294. The receiver 291 may sample the data DATA received from a DQ signal line. The receiver 291 may include a plurality of sampler circuits 292*a*, . . . , 292*h* and a plurality of latches 293*a*, . . . , 293*h*. The divided clock signals DCKa, . . . , DCKh may be applied to a plurality of sampler circuits 292*a*, . . . , 292*h*, respectively, and a plurality of sampler circuits 292*a*, . . . , 292*h* may sample the data DATA in synchronization with the applied divided clock signals DCKa, . . . , DCKh. The latch 293 may latch and output the sampled data DATA.

The calibration circuit 294 may perform the offset calibration to compensate for the offset of the sampler circuit 292. Specifically, the calibration circuit 294 may perform the offset calibration of generating an offset adjustment signal CAL_DATA used to compensate for the offset of the sampler circuit 292. The offset calibration may be performed by using the voltage difference between the voltages output from two output terminals of the sampler circuit 292 when an input signal and a reference signal are applied to the sampler circuit 292. In some embodiments, the calibration circuit 294 is capable of generating the offset adjustment signal CAL_DATA such that the voltage difference of the voltages output from two output terminals is minimized. The calibration circuit 294 may generate the offset adjustment signal CAL_DATA that compensates the offset voltage so that the voltages output from two output terminals have the voltage difference within a predetermined range. When the offset calibration for sampler circuit 292*a* is performed, the clock signal applied to the sampler circuit 292*a* generates, by a parasitic capacitor, a kick-back noise that affects other signals input to the sampler circuit 292*a*. The kick-back noise caused by the clock signal may affect the reference signal applied to the sampler circuit 292*a*. During the general operation of receiving the data DATA, the clock signals DCKa, . . . , DCKh with the phase difference are simultaneously applied to a plurality of sampler circuits 292*a*, . . . , 292*h* and the kick-back noise generated by the clock signals of the opposite phases may offset each other, so the kick-back noise effect of the clock signal on the reference signal is small. However, if the clock signal is applied to each of the sampler circuits 292*a*, . . . , 292*h* when the offset calibration is performed, the reference signal may be affected by the kick-back noise of one clock signal. The offset adjustment signal CAL_DATA generated using the reference signal affected by the kick-back noise does not accurately compensate for the offset voltage in the normal operation of receiving the data DATA. The calibration circuit 294 according to an embodiment may provide two clock signals having opposite phases to the sampler circuit 292 during the offset calibration period. Since two clock signals with opposite phases are provided to the sampler circuit 292, the kick-back noise may be offset. That is, since the calibration circuit 294 generates the offset adjustment signal CAL_DATA using the reference signal that is less affected by kick-back noise, it is possible to accurately compensate for the offset voltage that occurs during the normal operation of receiving the data DATA.

Figure 3:
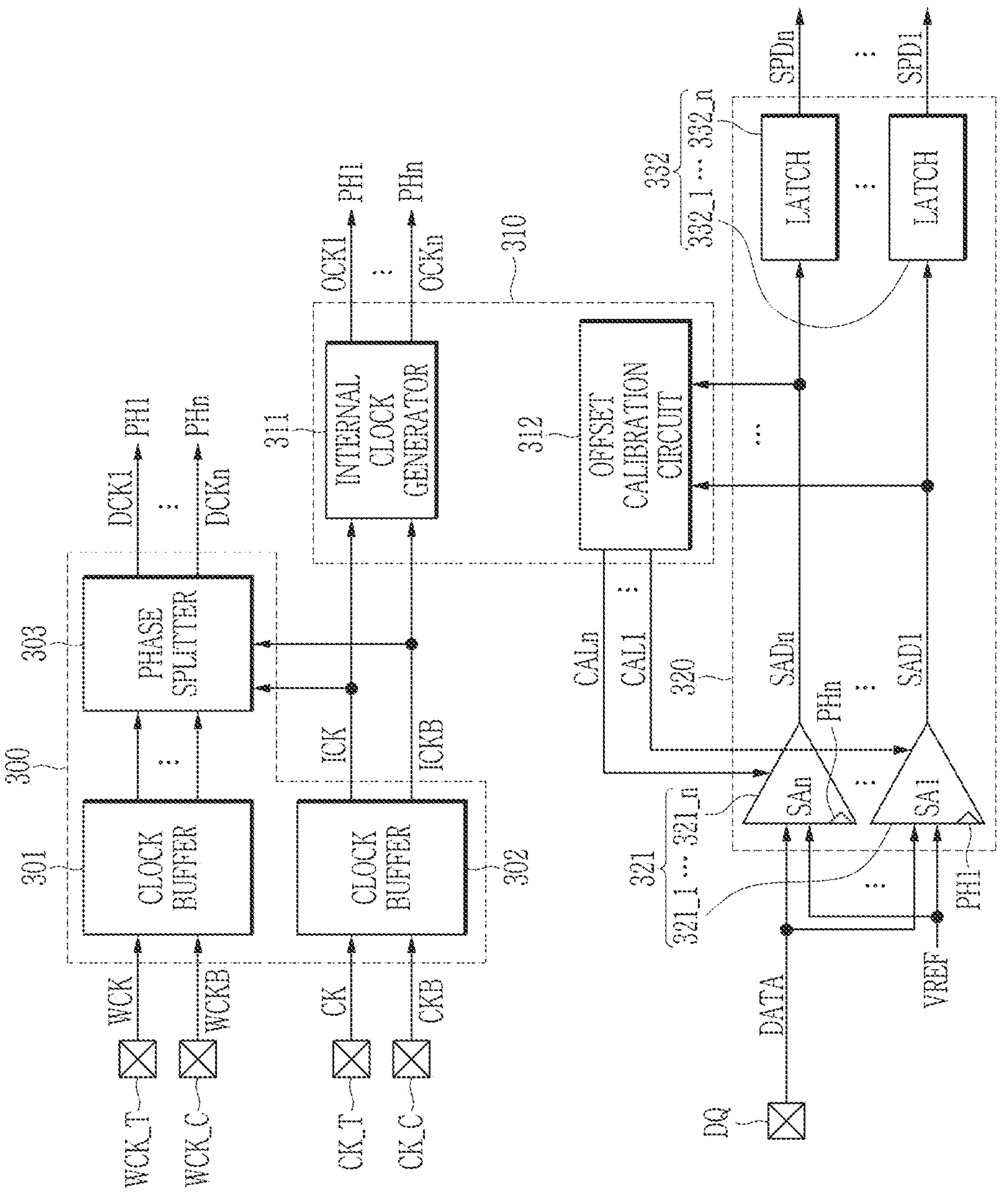
FIG. 3 is a block diagram showing a clock control circuit, a receiver, and a calibration circuit of a semiconductor memory device according to an embodiment.

FIG. 3 is a block diagram showing a clock control circuit, a receiver, and a calibration circuit of a semiconductor memory device according to an embodiment.

Referring to FIG. 3, the clock control circuit 300 may include clock buffers 301 and 302 and a phase splitter 303. A calibration circuit 310 may include an internal clock generator 311 and an offset calibration circuit 312. A receiver 320 may include a plurality of sampler circuits 321_1, . . . , 321_*n* and a plurality of latches 332_1, . . . , 332_*n* (e.g., collectively latches 332)

The clock buffer 301 receives the data clock signals WCK and WCKB transmitted through the data clock pads WCK_T and WCK_C. The clock buffer 301 may buffer the received data clock signals WCK, WCKB and provide them to the phase splitter 303.

The clock buffer 302 receives the system clock signals CK and CKB transmitted through the clock pads CK_T and CK_C. The clock buffer 302 may buffer the received system clock signals CK and CKB to be provided to the phase splitter 303. The clock buffer 302 may provide the buffered system clock signals ICK and ICKB to the internal clock generator 311 as well as other circuits.

The phase splitter 303 may receive the clock signals ICK and ICKB and the data clock signals WCK and WCKB buffered in the clock buffer 301 and generate the divided clock signals DCK1, . . . , DCKn. The phase splitter 303 may generate the n divided clock signals DCK1, . . . , DCKn. The divided clock signals DCK1, . . . , DCKn may have different phases. For example, each phase of the n divided clock signals DCK1, . . . , DCKn may be 360/n*0, . . . , 360/n*(n−1). The divided clock signals DCK1, . . . , DCKn may be applied to the clock input terminals PH1, . . . , PHn of the sampler circuit 321. The phase splitter 303 may match the phase of the first divided clock signal DCK1 among the divided clock signals DCK1, . . . , DCKn to the clock signal ICK.

The internal clock generator 311 may receive the clock signals ICK and ICKB during the offset calibration period and generate the offset clock signals OCK1, . . . , OCKn to perform the offset calibration. The offset clock signals OCK1, . . . , OCKn may be applied to the clock input terminals PH1, . . . , PHn of the sampler circuit 321.

The plurality of sampler circuits 321_1, . . . , **321_*n* may receive the data DATA. The plurality of sampler circuits 321_1, . . . , 321_*n* may sample the data DATA in synchronization with the applied divided clock signals DCK1, . . . , DCKn, respectively. The plurality of sampler circuits 321_1, . . . , 321_*n* may output the sampled signals SAD1, . . . , SADn to the plurality of latches 322_1, . . . , 322_*n***.

The plurality of latches 322_1, . . . , **322_*n* may latch the output signals SAD1, . . . , SADn of the sampler circuit 321 to be output as the sampling data SPD1**, . . . , SPDn.

When performing the offset calibration, the offset calibration circuit 312 may receive the output signals SAD1, . . . , SADn of the sampler circuit 321 to generate the offset adjustment signals CAL1, . . . , CALn. The offset adjustment signals CAL1, . . . , CALn may be used to adjust the offset voltage of the sampler circuits 321_1, . . . , **321_*n*, respectively. In some embodiments, when performing the offset calibration by the offset calibration circuit 312, the internal clock generator 311 may generate a plurality of offset clock signals OCK1, . . . , OCKn to be output to the plurality of sampler circuits 321_1, . . . , 321_*n*. If the number of sampler circuits 321_1, . . . , 321_*n* is n, a plurality of offset clock signals OCK, . . . , OCKn have a phase difference of 360/n degrees, and n may be a natural number. The internal clock generator 311 may output the offset clock signals having the opposite phases to the plurality of sampler circuits 321_1, . . . , 321_*n*. The internal clock generator 311 may apply the first offset clock signal to the first sampler circuit with which the offset calibration is performed and may apply the second offset clock signal having the phase opposite to the first offset clock signal to the second sampler circuit. For example, the internal clock generator 311 may apply the offset clock signal having the phase of 180 degrees to the second sampler circuit while applying the offset clock signal having the phase of 0 degrees to the first sampler circuit. The offset calibration circuit 312 may perform the offset calibration by using the signal output from the first sampler circuit. The offset calibration circuit 312 may sequentially perform the offset calibration for a plurality of sampler circuits 321_1, . . . , 321_*n* in the order of the phase difference of each of a plurality of offset clock signals OCK, . . . , OCKn applied to each of a plurality of sampler circuits 321_1, . . . , 321_*n***.

Figure 4:
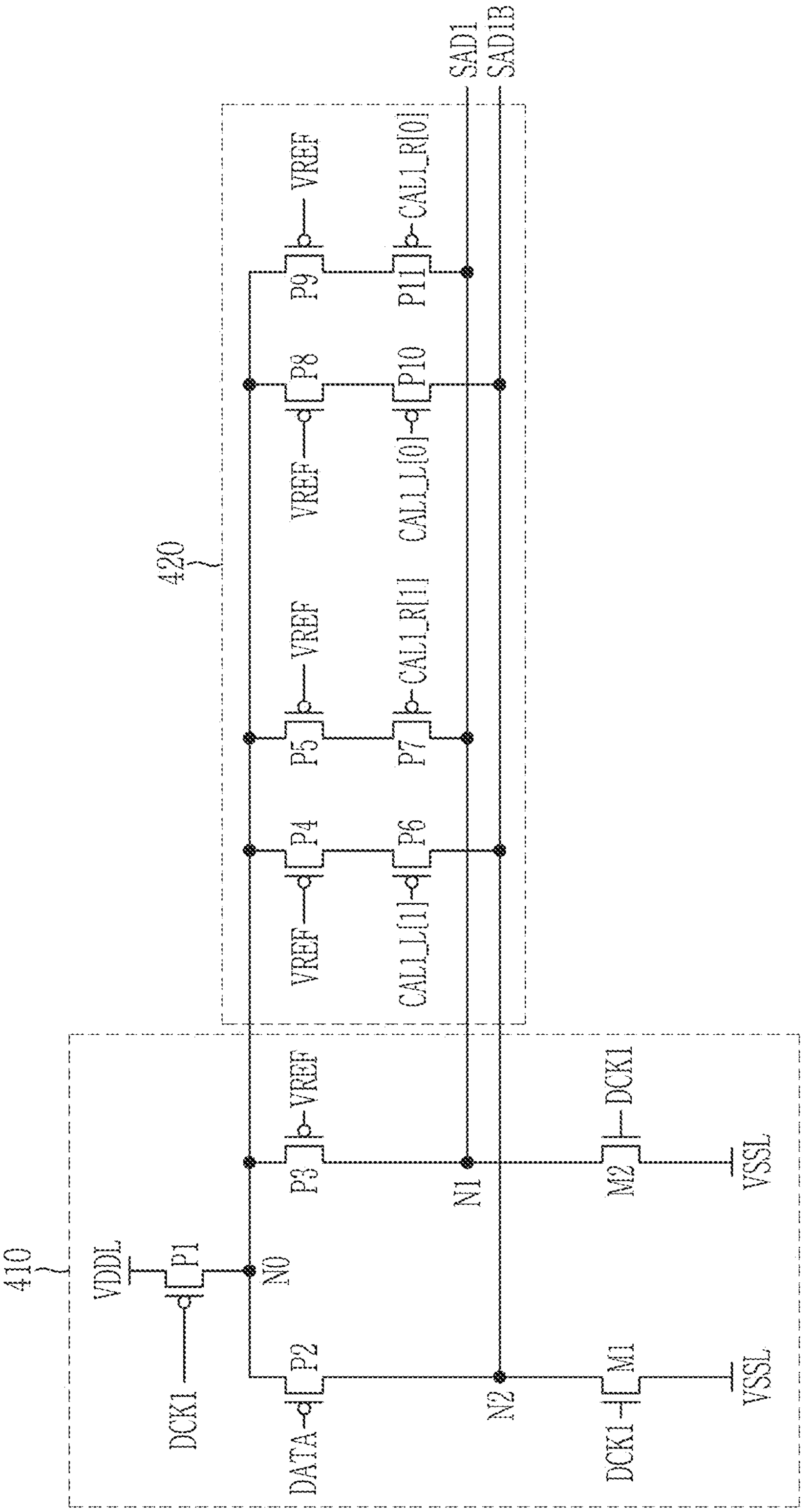
FIG. 4 is a circuit diagram schematically showing a sense amplifier of FIG. 3.

FIG. 4 is a circuit diagram schematically showing a sampler circuit of FIG. 3.

Referring to FIG. 4, the sampler circuit 400 includes an amplifier 410 and an offset adjustment circuit 420. The amplifier 410 may compare input signals DATA and VREF with each other and amplify a voltage difference between the signals DATA and VREF. The amplifier 410 may output the output signals SAD1 and SAD1B from the nodes N1 and N2, respectively. The amplifier 410 may determine the voltage levels of the output signals SAD1 and SAD2 according to the comparison result of the data DATA and the reference signal VREF. In some embodiments, the reference signal VREF is generated inside an integrated circuit in which the sampler circuit 400 is implemented or may be provided from an external device (an integrated circuit or a separate electronic device in which the sampler circuit 400 is implemented, for example, a memory controller, etc.).

The amplifier 410 may include transistors P1, P2, P3, M1, and M2. The data DATA may be input to the gate of the transistor P2. The reference signal VREF may be input to the gate of the transistor P3. The divided clock signal DCK1 may be input to the gate of the transistors P1, M1, and M2. A first operating voltage VDDL is applied to one terminal of the transistor P1, and the other terminal is connected to one terminal of the transistors P2 and P3 at a node N0. The transistors P2 and M1 are connected in series between the node N0 and a power supply terminal to which the voltage VSSL is supplied, and the node to which the transistors P2 and M1 are connected is an output node N2. The transistors P3 and M2 are connected in series between the node N0 and the power supply terminal to which the voltage VSSL is supplied, and the node to which transistors P3 and M2 are connected is an output node N1.

When the divided clock signal DCK1 is applied to the transistors P1, M1, and M2, a kick-back noise may occur due to a parasitic capacitance of the transistors P1, M2, and P3. The kick-back noise affects the reference signal VREF. This is described with reference to FIG. 5.

Figure 5:
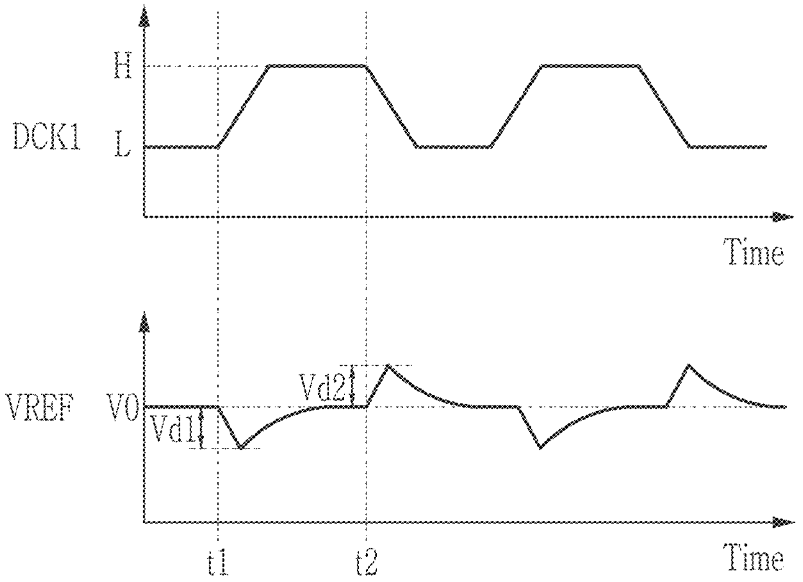
FIG. 5 is a graph showing a waveform of signals input to an amplifier of FIG. 4.

FIG. 5 is a graph showing a waveform of signals input to an amplifier of FIG. 4.

At a time t1, a divided clock signal DCLK1 is transitioned from low level L to high level H. Then, the transistor P1 is turned off, and the transistor M2 is turned on. The drain voltage of the turned-off transistor P1 (i.e., a source voltage of the transistor P3) decreases. The drain voltage of the turned-on transistor M2 (i.e., the drain voltage of the third transistor P3) decreases. When the source voltage of the transistor P3 is reduced, the voltage of the reference signal VREF input to the gate of the transistor P3 is reduced due to a parasitic capacitance between the gate and the source of the transistor P3. Also, if the drain voltage of the transistor P3 is reduced, the voltage of the reference signal VREF input to the gate of the transistor P3 is reduced due to a parasitic capacitance between the gate and the drain of the transistor P3. Due to this kick-back noise, a voltage change by the voltage Vd1 may be generated in the reference signal VREF.

At a time t2, the divided clock signal DCLK1 is transitioned from low level H to high level L. Then, the transistor P1 is turned on and the transistor M2 is turned off. The drain voltage (i.e., source voltage of the transistor P3) of the turned-on transistor P1 increases. The drain voltage of the turned-off transistor M2 (i.e., the drain voltage of the third transistor P3) increases. When the source voltage of the transistor P3 increases, the voltage of the reference signal VREF input to the gate of the transistor P3 increases due to the parasitic capacitance between the gate and the source of the transistor P3. Also, when the drain voltage of the transistor P3 is increased, the voltage of the reference signal VREF input to the gate of the transistor P3 increases due to the parasitic capacitance between the gate and the drain of the transistor P3. Due to this kick-back noise, a voltage change by the voltage Vd2 may be generated in the reference signal VREF.

Again, referring to FIG. 4, the offset adjustment circuit 420 may apply an offset adjustment voltage according to offset adjustment signals CAL1_L[1], CAL1_R[1], CAL1_L[0], and CAL1_R[0] to the output nodes N1 and N2 of the amplifier 410. The offset adjustment voltage may be used to cancel the offset voltage at the input of the individual amplifier, for example, due to a transistor mismatch within the individual amplifier and/or other causes.

The offset adjustment circuit 420 may include transistors P4, . . . , P11. The transistors P4 and P6 are coupled in series between the node N0 and the output node N2. The transistors P5 and P7 are coupled in series between the node N0 and the output node N1. The transistors P8 and P10 are coupled in series between the node N0 and the output node N2. The transistors P9 and P11 are coupled in series between the node N0 and the output node N1.

The reference signal VREF may be applied to the gates of the transistors P4, P5, P8, and P9. The offset adjustment signals CAL1_L[1], CAL1_R[1], CAL1_L[0], and CAL1_R[0] may be applied to the gates of the transistors P4, P5, P8, and P9, respectively. The amount of the current of the transistors P4, P5, P8, and P9 is adjusted differently by the offset adjustment signals CAL1_L[1], CAL1_R[1], CAL1_L[0], and CAL1_R[0], and the adjusted current is combined with the current flowing through the transistors P2 and P3 according to the input signals DATA and VREF to control the voltage of the nodes N1 and N2. Therefore, in the state that the offset voltage of the output nodes N1 and N2 of the amplifier 410 is adjusted by the offset adjustment circuit 420, when the signal amplification is performed in the amplifier 410, the accurately amplified output signals SAD1 and SAD1B may be output at the output nodes N1 and N2.

Figure 6:
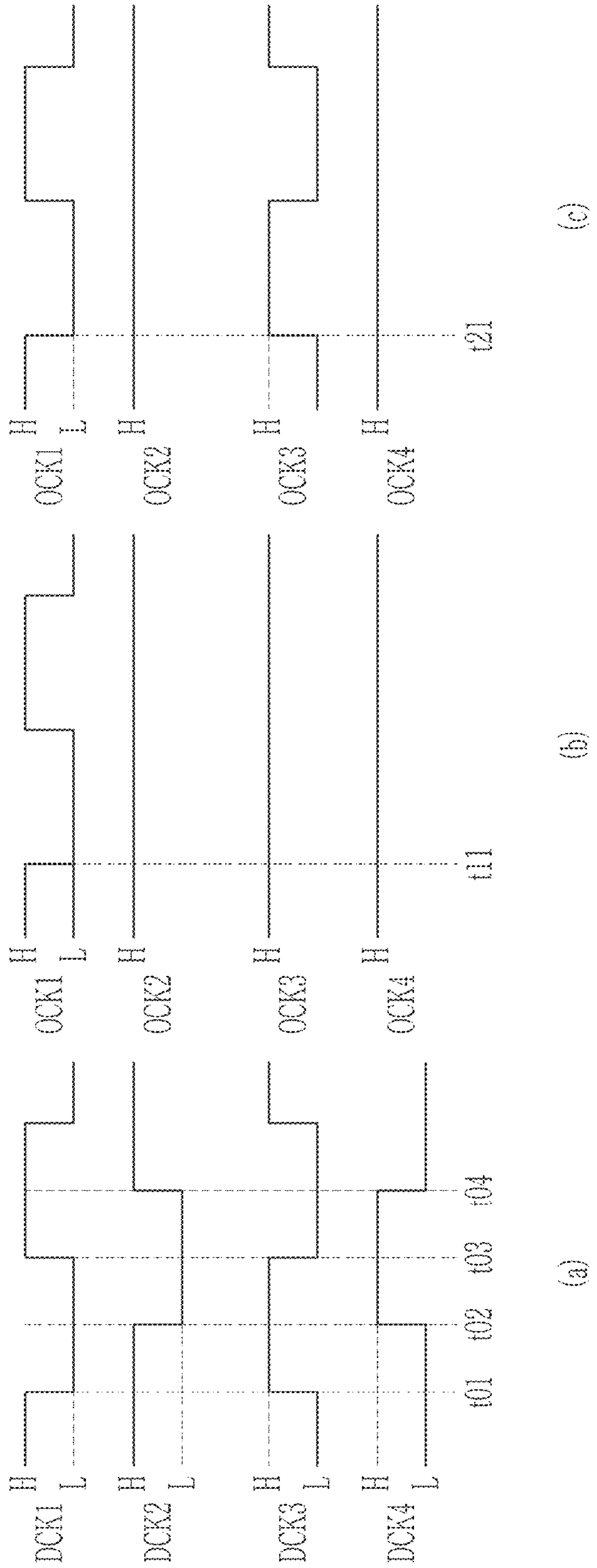
FIG. 6 is a timing diagram showing a clock signal applied to a sense amplifier according to an embodiment.
Figure 7:
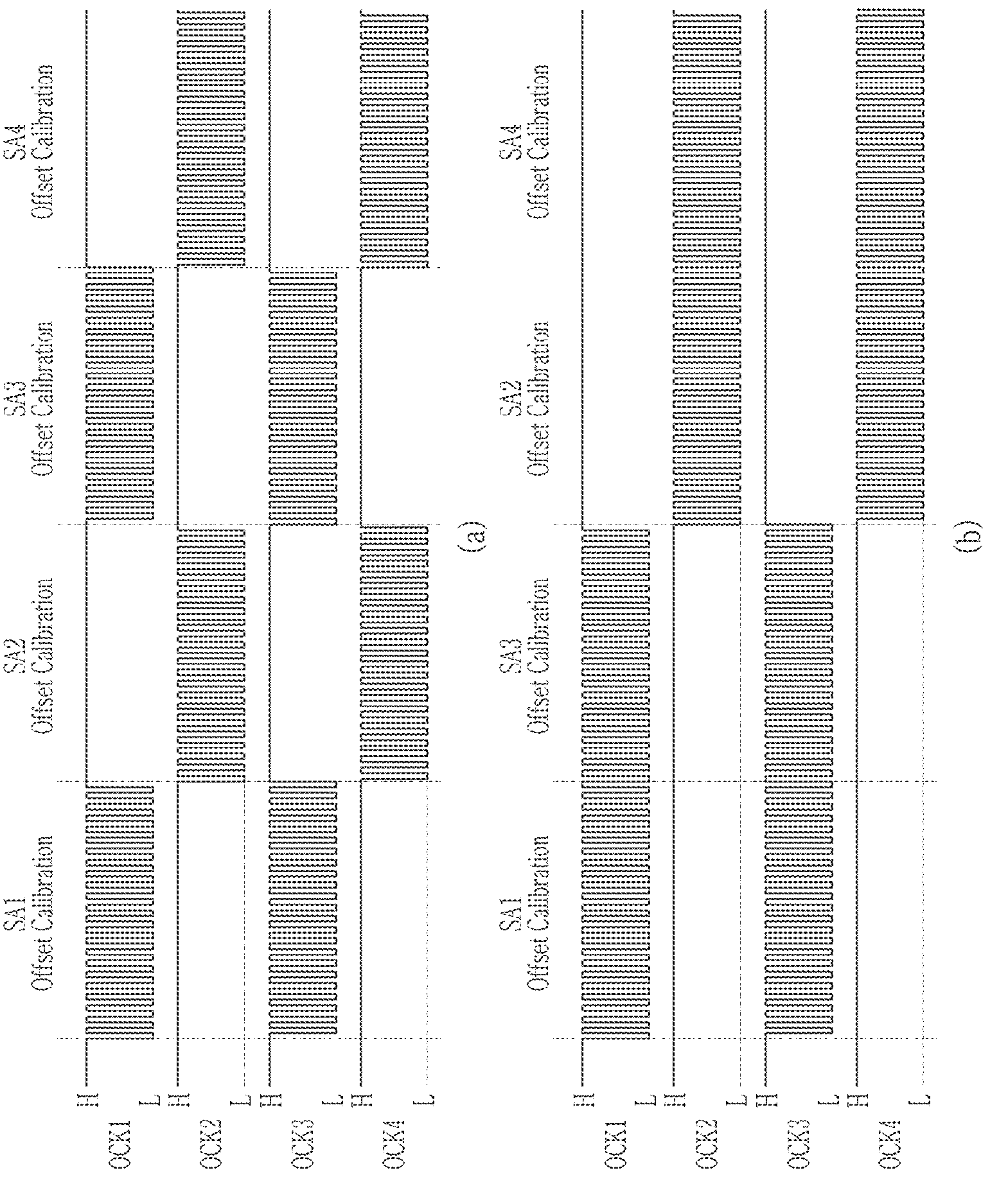
FIG. 7 is a view showing a clock signal applied during an offset calibration period of a sense amplifier according to an embodiment.

FIG. 6 is a timing diagram showing a clock signal applied to a sense amplifier according to an embodiment, and FIG. 7 is a view showing a clock signal applied during an offset calibration period of a sense amplifier according to an embodiment.

FIG. 6 and FIG. 7 show four offset clock signals OCK1, . . . , OCK4 applied to four sampler circuits during an offset calibration period. Each phase of four offset clock signals OCK1, . . . , OCK4 is 360/4*0, . . . , 360/4*3 (i.e., 0, 90, 180, and 270). In FIG. 6 and FIG. 7, four sampler circuits are described, but in the case of n sampler circuits, each phase of the n offset clock signals OCK1, . . . , OCKn is 360/n*0, . . . , 360/n*(n−1), and the following description may be equally applicable.

Referring to FIG. 6(*a*), while the data DATA is received, the divided clock signals DCK1, . . . , DCK4 applied to the sampler circuits may all be toggled while having a constant phase difference from each other. At a time t01, when the divided clock signal DCK1 is transitioned from high level H to low level L, the data DATA may be sampled by the sampler circuit to which the divided clock signal DCK1 is applied. At the time t01, as the divided clock signal DCK1 is transitioned from high level H to low level L, the kick-back noise is generated, however as the divided clock signal DCK3 having the opposite phase is transitioned from low level L to high level H, the kick-back noise that offsets the kick-back noise caused by the divided clock signal DCK1 may is generated. At a time t02, as the divided clock signal DCK2 is transitioned from high level H to low level L, the kick-back noise is generated, however as the divided clock signal DCK4 having the opposite phase is transitioned from low level L to high level H, the kick-back noise that offsets the kick-back noise caused by the divided clock signal DCK2 may be generated. At a time t03, as the divided clock signal DCK3 is transitioned from high level H to low level L, the kick-back noise is generated, however as the divided clock signal DCK1 having the opposite phase is transitioned from low level L to high level H, the kick-back noise that offsets the kick-back noise caused by the divided clock signal DCK3 may be generated. At a time t04, as the divided clock signal DCK4 is transitioned from high level H to low level L, the kick-back noise is generated, however as the divided clock signal DCK2 having the opposite phase is transitioned from low level L to high level H, the kick-back noise that offsets the kick-back noise caused by the divided clock signal DCK4 may be generated. Therefore, while the sampler circuits sample the data, the effect of the kick-back noise generated by the divided clock signals DCK1, . . . , DCK4 with respect to the reference signal is very small.

Referring to FIG. 6(*b*), the offset clock signal OCK1 input to the sampler circuit where the offset calibration is performed is toggled during the offset calibration period, and the offset clock signals OCK2, . . . , OCK4 input to the remaining sampler circuits are not toggled and are maintained at high level H. As the offset clock signal OCK1 is transitioned from high level H to low level L at a time t11, the kick-back noise may be generated. This kick-back noise may affect the reference signal applied to the sampler circuit and may cause the generation of an inaccurate offset adjustment signal.

Referring to FIG. 6(*c*), during the offset calibration period, the offset clock signal OCK1 input to the sampler circuit on which the offset calibration is performed is toggled, the offset clock signal OCK3 input to the other sampler circuit is toggled, and the remaining offset clock signals OCK2 and OCK4 are not toggled and are maintained at high level H. The kick-back noise is generated as the offset clock signal OCK1 is transitioned from high level H to low level L at a time t21, however the offset clock signal OCK3 having the opposite phase is transitioned from low level L to high level H, so the kick-back noise that offsets the kick-back noise caused by the offset clock signal OCK1 may be generated. The receiver according to an embodiment applies the offset clock signal OCK3 having the phase opposite to that of the offset clock signal OCK1 applied to the sampler circuit on which the offset calibration operation is performed to another sampler circuit, thereby offsetting the kick-back noise caused by the offset clock signal OCK1. Therefore, for the reference signal, just as the sampler circuits sample the data, the effect of the kick-back noise generated by the offset clock signals OCK1, . . . , OCK4 is very small. Accordingly, the offset adjustment signal that compensates for the offset voltage in the operation of receiving the data DATA may be generated.

In some embodiments, as shown in FIG. 6(*a*), during the offset calibration period, the offset clock signal OCK1 input to the sampler circuit where the offset calibration is performed may be toggled, and the remaining offset clock signals OCK2, OCK3, and OCK4 may all be toggled. in this case, as when the sampler circuits sample the data, for the reference signal, the effect of the kick-back noise generated by the offset clock signals OCK1, . . . , OCK4 is very small. Accordingly, the offset adjustment signal that compensates for the offset voltage in the operation of receiving data DATA may be generated.

Referring to FIG. 7(*a*), the offset calibration for the sampler circuit SA1, the sampler circuit SA2, the sampler circuit SA3, and the sampler circuit SA4 may be sequentially performed. For example, after the offset calibration of the sampler circuit SA1 is performed, the offset calibration for the sampler circuit SA2 receiving the offset calibration clock signal OCK2 having a predetermined phase difference (e.g., 90 degrees) from the offset calibration clock signal OCK1 applied to the sampler circuit SA1 may be performed. After the offset calibration for the sampler circuit SA2 is performed, the offset calibration for the sampler circuit SA3 receiving the offset calibration clock signal OCK3 having a predetermined phase difference (e.g., 90 degrees) from the offset calibration clock signal OCK2 applied to the sampler circuit SA2 may be performed. The sum of the phase difference between the offset calibration clock signal OCK2 and the offset calibration clock signal OCK1, and the phase difference between the offset calibration clock signal OCK3 and the offset calibration clock signal OCK2, may be 180 degrees. That is, the offset calibration may be sequentially performed for a plurality of sampler circuits SA1, . . . , SA4.

During the offset calibration period for the sampler circuit SA1, the offset calibration clock OCK1 applied to the sampler circuit SA1 and the offset calibration clock OCK3 in the opposite phase to the offset calibration clock OCK1 are toggled. Similarly, during the offset calibration period for the sampler circuit SA2, the offset calibration clock OCK2 applied to the sampler circuit SA2 and the offset calibration clock OCK4 of the opposite phase to the offset calibration clock OCK2 are toggled. During the offset calibration period for the sampler circuit SA3, the offset calibration clock OCK3 applied to the sampler circuit SA3 and the offset calibration clock OCK1 of the opposite phase to the offset calibration clock OCK3 are toggled. Similarly, during the offset calibration period for the sampler circuit SA4, the offset calibration clock OCK4 applied to the sampler circuit SA4 and the offset calibration clock OCK2 of the opposite phase to the offset calibration clock OCK4 are toggled.

Referring to FIG. 7(*b*), as the pairs of the offset calibration clock signals OCK1, OCK3/OCK2, OCK4 of the opposite phases to each other are applied, the offset calibration may be performed on the sampler circuit pairs SA1, SA3/SA2, SA4 to which the offset calibration clock signal pairs are applied. When the offset calibration clock signal pair OCK1 and OCK3 is applied, the offset calibration for the sampler circuit SA1 may be performed and the offset calibration for the sampler circuit SA3 may be performed. When the offset calibration clock signal pair OCK2 and OCK4 is applied, the offset calibration for the sampler circuit SA2 may be performed and the offset calibration for the sampler circuit SA4 may be performed.

That is, in FIG. 7(*a*), the offset calibration period for the sampler circuit SA1, the offset calibration period for the sampler circuit SA2, the offset calibration period for the sampler circuit SA3, and the offset calibration period for the sampler circuit SA4 are described to be sequential; however, like FIG. 7(*b*), the offset calibration may be performed in the order of the offset calibration period for the sampler circuit SA1, the offset calibration period for the sampler circuit SA3, the offset calibration period for the sampler circuit SA2, and the offset calibration period for the sampler circuit SA4.

In the above, it is described that the offset calibration clock OCK1 is applied to the sampler circuit SA1, and the offset calibration clock OCK3 of the opposite phase to the offset calibration clock OCK1 is applied to the sampler circuit SA3, however the offset calibration clock OCK3 may be applied to at least one among other sampler circuits SA2, SA3, and SA4.

Figure 8:
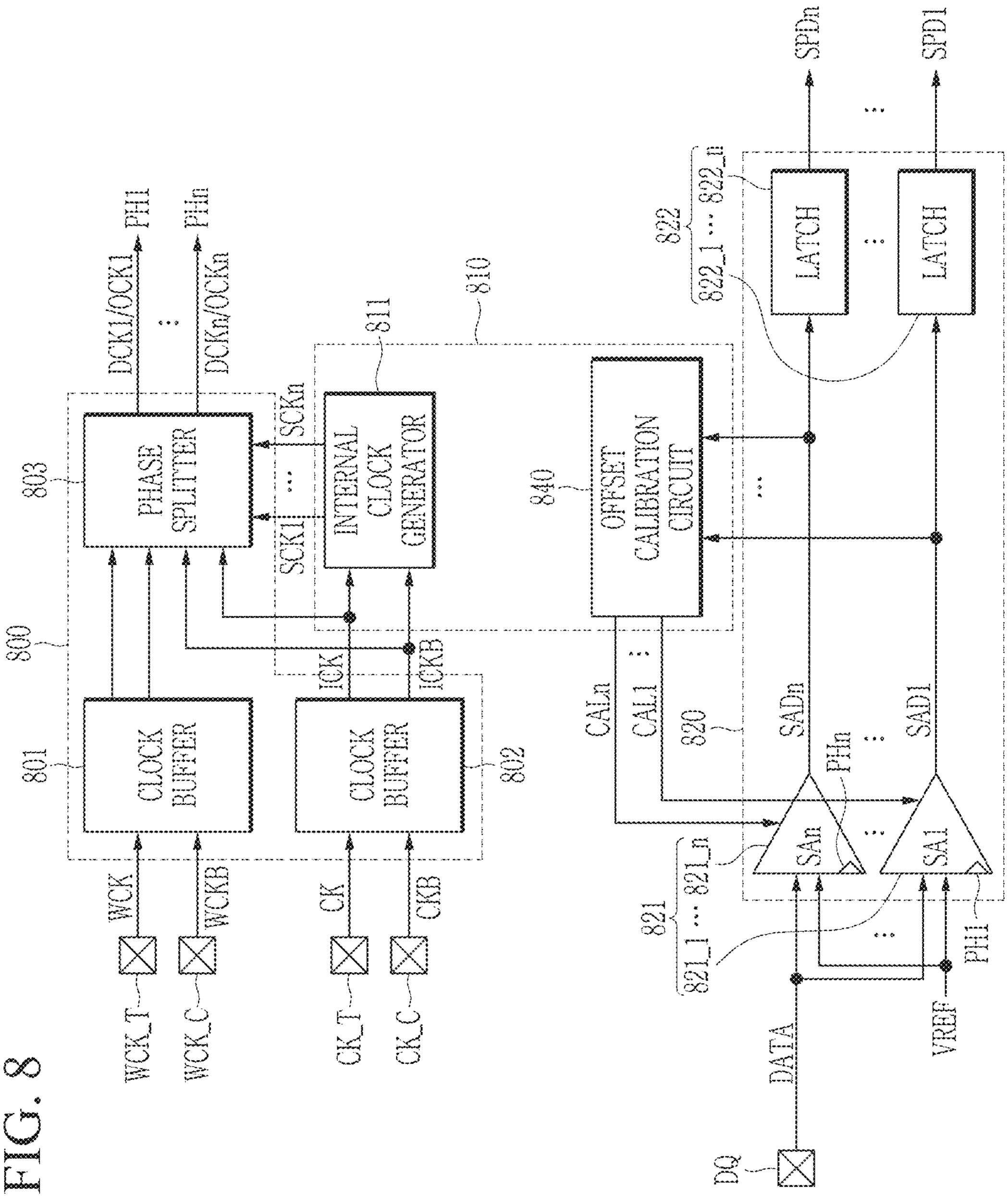
FIG. 8 is a block diagram showing a clock control circuit, a receiver, and a calibration circuit of a semiconductor memory device according to another embodiment.

FIG. 8 is a block diagram showing a clock control circuit, a receiver, and a calibration circuit of a semiconductor memory device according to another embodiment.

Referring to FIG. 8, a clock control circuit 800 may include clock buffers 801 and 802 and a phase splitter 803. A calibration circuit 810 may include an internal clock generator 811 and an offset calibration circuit 840. A receiver 820 may include a plurality of sampler circuits 821_1, . . . , **821_*n* and a plurality of latches 822_1, . . . , 822_*n* (e.g., collectively latches 822**).

The descriptions for the clock buffers 801 and 802, the plurality of sampler circuits 821_1, . . . , **821_*n*, the plurality of latches 822_1, . . . , 822_*n*, and the calibration circuit 810 are similar to or the same as in FIG. 3**, so are omitted.

The internal clock generator 811 may generate internal clock signals SCK1, . . . , SCKn during the offset calibration period to be provided to the phase splitter 803.

During the period receiving the data DATA, the phase splitter 803 may receive the clock signals ICK and ICKB buffered in the clock buffer 802 and the data clock signals WCK and WCKB buffered in the clock buffer 801 and generate the divided clock signals DCK1, . . . , DCKn. During the offset calibration period, the phase splitter 803 may use the internal clock signals SCK1, SCKn to generate the offset clock signals OCK1, . . . , OCKn. In some embodiments, the phase splitter 803 may receive the internal clock signal pair having the opposite phases from the internal clock generator 811 on the internal signal path of the phase splitter 803 during the offset calibration to output the offset clock signals OCK1, . . . , OCKn. This is described with reference to FIG. 10 and FIG. 11. In some embodiments, the phase splitter 803 may apply the offset clock signals OCK1, . . . , OCKn to the clock input terminals PH1, . . . , PHn of the sampler circuit 821. In some embodiments, the phase splitter 803, during the offset calibration, may receive the internal clock signal pair having the opposite phases from the internal clock generator 811 to the input terminal of the phase splitter 803 to output the offset clock signals OCK1, . . . , OCKn. This is described with reference to FIG. 12 later.

Figure 9:
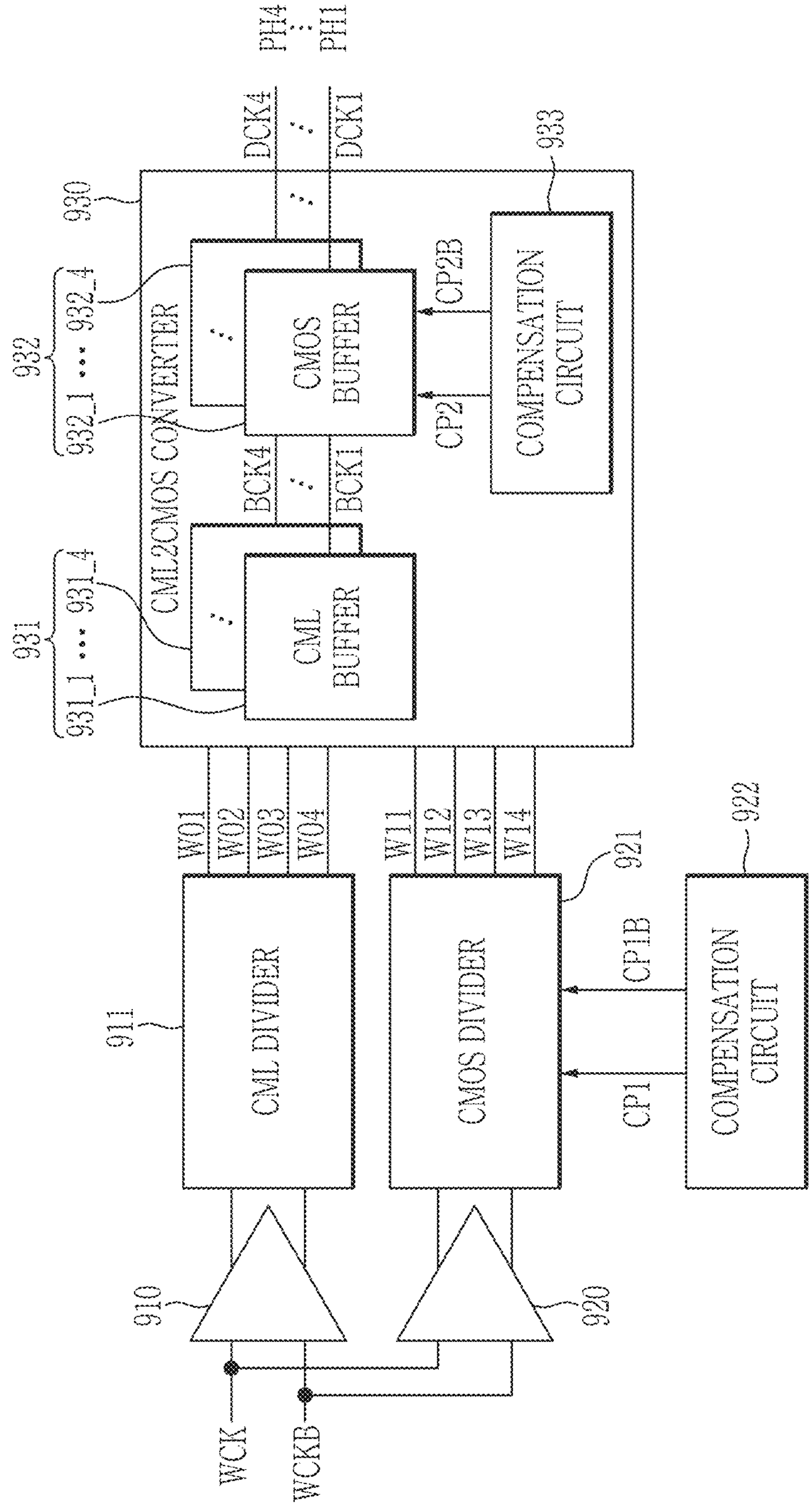
FIG. 9 is a block diagram showing an example of a phase splitter according to another embodiment.

FIG. 9 is a block diagram showing an example of a phase splitter according to another embodiment.

Referring to FIG. 9, the phase splitter 900 may include buffers 910 and 920, a first divider 911, a second divider 921, and a converter 930.

The buffer 910 may receive the data clock signal WCK and the complementary data clock signal WCKB and differentially amplify the data clock signal WCK and the complementary data clock signal WCKB. The first divider 911 may divide the output of the buffer 910 to generate a plurality of first clock signals W01, . . . , W04 having different phases. For example, the first divider 911 may generate first clock signals W01, . . . , W04 by four-way dividing the frequency of the output of the buffer 910. The output terminal of the first divider 911 may be connected to the input terminal of the first buffer 931. For example, each of the first clock signals W01, . . . , W04 may be applied to each of the first buffers 931_1, . . . , 931_4.

The buffer 920 may receive the data clock signal WCK and the complementary data clock signal WCKB and differentially amplify the data clock signal WCK and the complementary data clock signal WCKB.

The second divider 921 may divide the output of the buffer 920 to generate a plurality of second clock signals W11, . . . , W14 having different phases. For example, the second divider 921 may generate the second clock signals W11, . . . , W14 by four-way dividing the frequency of the output of the of the buffer 920. The output terminal of the second divider 921 may be connected to the input terminal of the second buffer 932. For example, the second clock signal W11 may be applied to the second buffer 932_1. The second clock signal W12 may be applied to the second buffer 932_2. The second clock signal W13 may be applied to the second buffer 932_3. The second clock signal W14 may be applied to the second buffer 932_4.

In some embodiments, the buffer 910 and the first divider 911 may be operated when the data clock signals WCK and WCKB of high frequency are applied and the buffer 920 and the second divider 921 may be operated when the data clock signals WCK and WCKB of low frequency are applied. The receiver activates the buffer 910 when the frequency of the data clock signal WCK is relatively high, and the buffer 910 may be operated to differentially amplify the data clock signal WCK and the complementary data clock signal WCKB and receive the data clock signal WCK and the complementary data clock signal WCKB. The buffer 910 may include a Current Mode Logic (CML) amplifier for amplifying a clock signal having a high frequency. The buffer 920 may include a complementary metal-oxide semiconductor (CMOS) amplifier for amplifying an accurate signal although the operation speed is relatively slow.

The compensation circuit 922 may provide compensation signals CP1 and CP1B to the second divider 921. If a voltage applied to the gate of some transistors among the transistors included in the second divider 921 that may be operated in the high voltage level region continues to have a constant voltage level, degradation due to a BTI (Bias Temperature Instability) phenomenon may occur. By changing the voltage level of the gate of some transistors by using the compensation signals CP1 and CP1B, the compensation circuit 922 may prevent the degradation of the transistor and increase the chip life-span and reliability of the operation.

The converter 930 may include a plurality of first buffers 931_1, . . . , 931_4 and a plurality of second buffers 932_1, . . . , 932_4. The converter 930 may amplify the first clock signals W01, . . . , W04 to be output as the divided clock signals DCK1, . . . , DCK4. For example, the pair of a first buffer 931_1 and a second buffer 932_1 may generate a divided clock signal DCK1 by detecting and amplifying the phase of the first clock signal W01 with respect to the phase of the first clock signal W03. The pair of the first buffer 931_1 and the second buffer 932_1 may generate a divided clock signal DCK1 that is substantially equivalent to the phase of the first clock signal W01 and having a greater amplitude than the first clock signal W01.

The plurality of first buffers 931_1, . . . , 931_4 may receive two first clock signals W01, . . . , W04 swinging with a CML level, respectively, and output as one signal BCK1, . . . , BCK4 swinging with a CML level. Each of the plurality of first buffers 931_1, . . . , 931_4 may receive two first clock signals among the first clock signals W01, . . . , W04 output from the first divider 911 and buffers them to output one signal BCK1, . . . , BCK4. For example, the first buffer 931_1 may receive first clock signals W01 and W03 having opposite phases and output one signal BCK1 swinging with the CML level. The first buffer 931_2 may receive first clock signals W02 and W04 having opposite phases and output one signal BCK2 swinging with the CML level. The first buffer 931_3 may also receive first clock signals W03 and W01 having opposite phases and output one signal BCK3 swinging with the CML level. The first buffer 931_4 may also receive first clock signals W04 and W02 having opposite phases and output one signal BCK4 swinging with the CML level. The plurality of second buffers 932_1, . . . , 932_4 may amplify and output one signal BCK1, . . . , BCK4 outputted from the plurality of first buffers 931_1, . . . , 931_4 and swinging with the CML level as one divided clock signal DCK1, . . . , DCK4 swinging with the CMOS level.

The compensation circuit 933 may provide compensation signals CP2 and CP2B to the second buffer 932. If the voltage applied to the gate of some transistors among the transistors included in the second buffer 932 that may be operated in the high voltage level region continues to have a constant voltage level, degradation due to the BTI phenomenon may occur. The compensation circuit 933 may change the voltage level of the gate of some transistors by using the compensation signals CP2 and CP2B.

In some embodiments, the compensation circuit 933 may apply an offset clock signal to the output terminal of the converter 930, that is, the clock input terminals PH1, . . . , PH4 of the sampler circuit, during the offset calibration. This is described with reference to FIG. 10 together.

Figure 10:
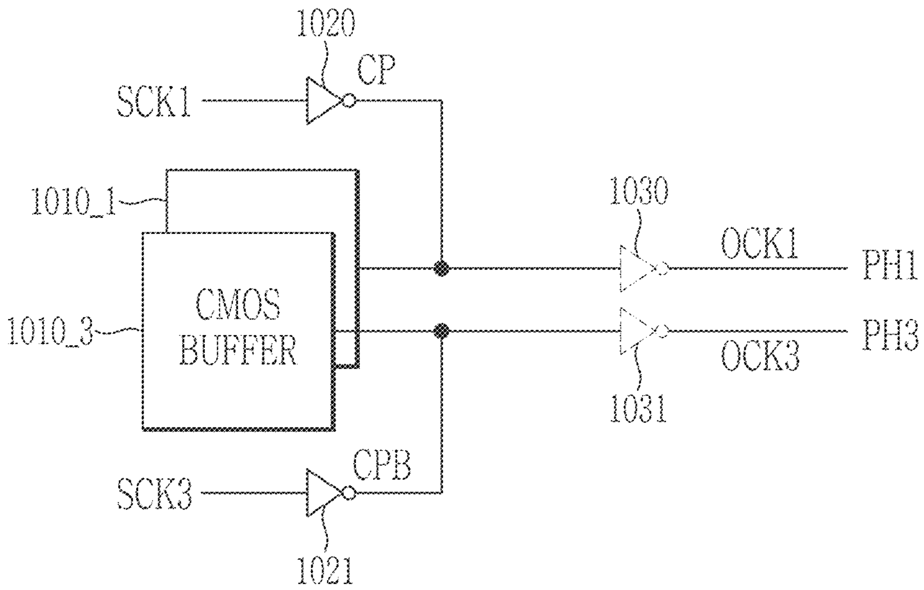
FIG. 10 is a view showing a connection state of a compensation circuit of a buffer that outputs a clock signal during an offset calibration period of a sense amplifier according to another embodiment.

FIG. 10 is a view showing a connection state of a compensation circuit of a buffer that outputs a clock signal during an offset calibration period of a sense amplifier according to another embodiment.

Referring to FIG. 10, the output terminal of the second buffer 1010_1 may be connected to the clock input terminal PH1 of the sampler circuit through a path having zero or more inverters 1030. The output terminal of the compensation circuit 1020 may also be connected to the clock input terminal PH1 of the sampler circuit through a path with zero or more inverters 1030. The compensation circuit 1020 may receive the internal clock signal SCK1 and output the compensation signal CP by buffering it. The compensation signal CP may be provided to the output terminal of the second buffer 1010_1 to be output to the clock input terminal PH1 of the sampler circuit as the offset clock signal OCK1. Similarly, the compensation circuit 1021 may receive the internal clock signal SCK3 and output the compensation signal CPB by buffering it. The compensation signal CPB may be provided to the output terminal of the second buffer 1010_3 to be output to the clock input terminal PH3 of the sampler circuit through a path having zero or more inverters 1031 as an offset clock signal OCK3. Since the internal clock signal SCK1 and the internal clock signal SCK3 have opposite phases, the offset clock signal OCK1 and the offset clock signal OCK3 may also have opposite phases. According to this embodiment, by using the signal path between the second buffers 1010_1 and 1010_3 connected to each other to provide the divided clock signals DCK1 and DCK3 and the clock input terminals PH1 and PH3 of the sampler circuit, the offset clock signals OCK1 and OCK3 may be provided.

In some embodiments, the compensation circuit 922 may output the offset clock signal by applying the compensation signals CP1 and CP1B to the output terminal of the second divider 921 during the offset calibration. This is described together with reference to FIG. 11.

Figure 11:
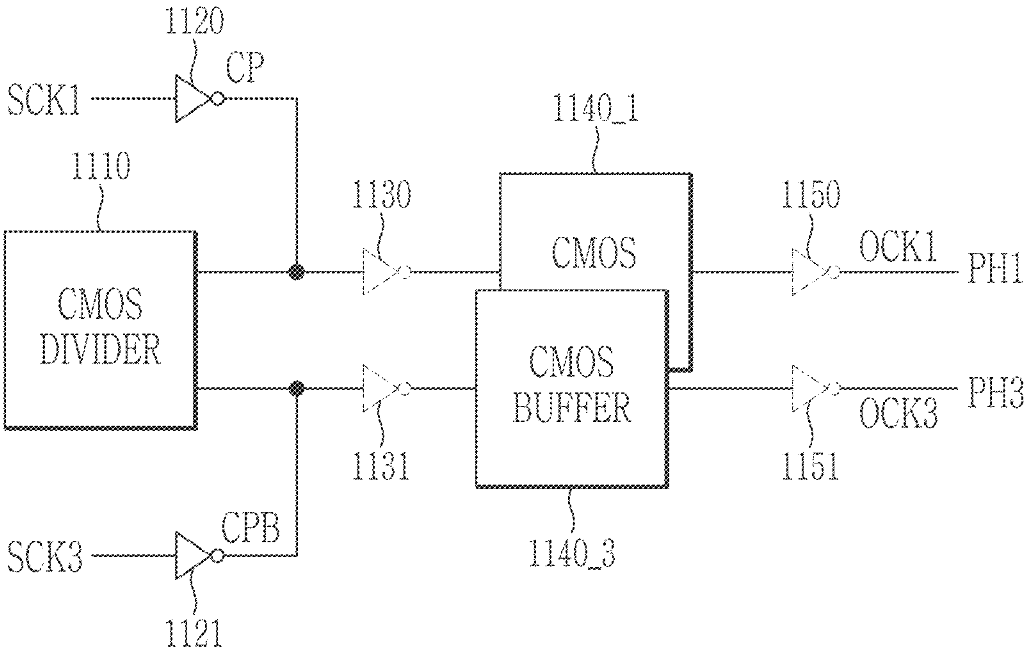
FIG. 11 is a view showing a connection state of a compensation circuit of a CMOS divider that outputs a clock signal during an offset calibration period of a sense amplifier according to another embodiment.

FIG. 11 is a view showing a connection state of a compensation circuit of a CMOS divider that outputs a clock signal during an offset calibration period of a sense amplifier according to another embodiment.

Referring to FIG. 11, the output terminal of the second divider 1110 may be connected to the input terminals of the second buffers 1140_1 and 1140_3 through a path having zero or more inverters 1130 and 1131. The output terminal of the second buffer 1140_1 may be connected to the clock input terminal PH1 of the sampler circuit through a path with zero or more inverters 1150. The output terminal of the second buffer 1140_3 may be connected to the clock input terminal PH3 of the sampler circuit through a path with zero or more inverters 1151. The output terminal of the compensation circuit 1120 may also be connected to the input terminal of the second buffer 1140_1 through a path with zero or more inverters 1130. The compensation circuit 1120 may receive the internal clock signal SCK1 and output the compensation signal CP to the input terminal of the second buffer 1140_1 by buffering it. The second buffer 1140_1 may amplify the input compensation signal CP to be output to the clock input terminal PH1 of the sampler circuit as an offset clock signal OCK1.

Similarly, the compensation circuit 1121 may receive the internal clock signal SCK3 and output the compensation signal CPB to the input terminal of the second buffer 1140_3 by buffering it. The second buffer 1140_3 may amplify the input compensation signal CPB to be output to the clock input terminal PH3 of the sampler circuit as the offset clock signal OCK3. Since the internal clock signal SCK1 and the internal clock signal SCK3 have opposite phases, the offset clock signal OCK1 and the offset clock signal OCK3 may also have opposite phases. According to this embodiment, by using the signal path between the second divider 1110, the second buffer 1140_1 and 1140_3, and the clock input terminals PH1 and PH3 of the sampler circuits connected to each other to provide the divided clock signals DCK1 and DCK3, it is possible to provide the offset clock signals OCK1 and OCK3 of opposite phases.

Figure 12:
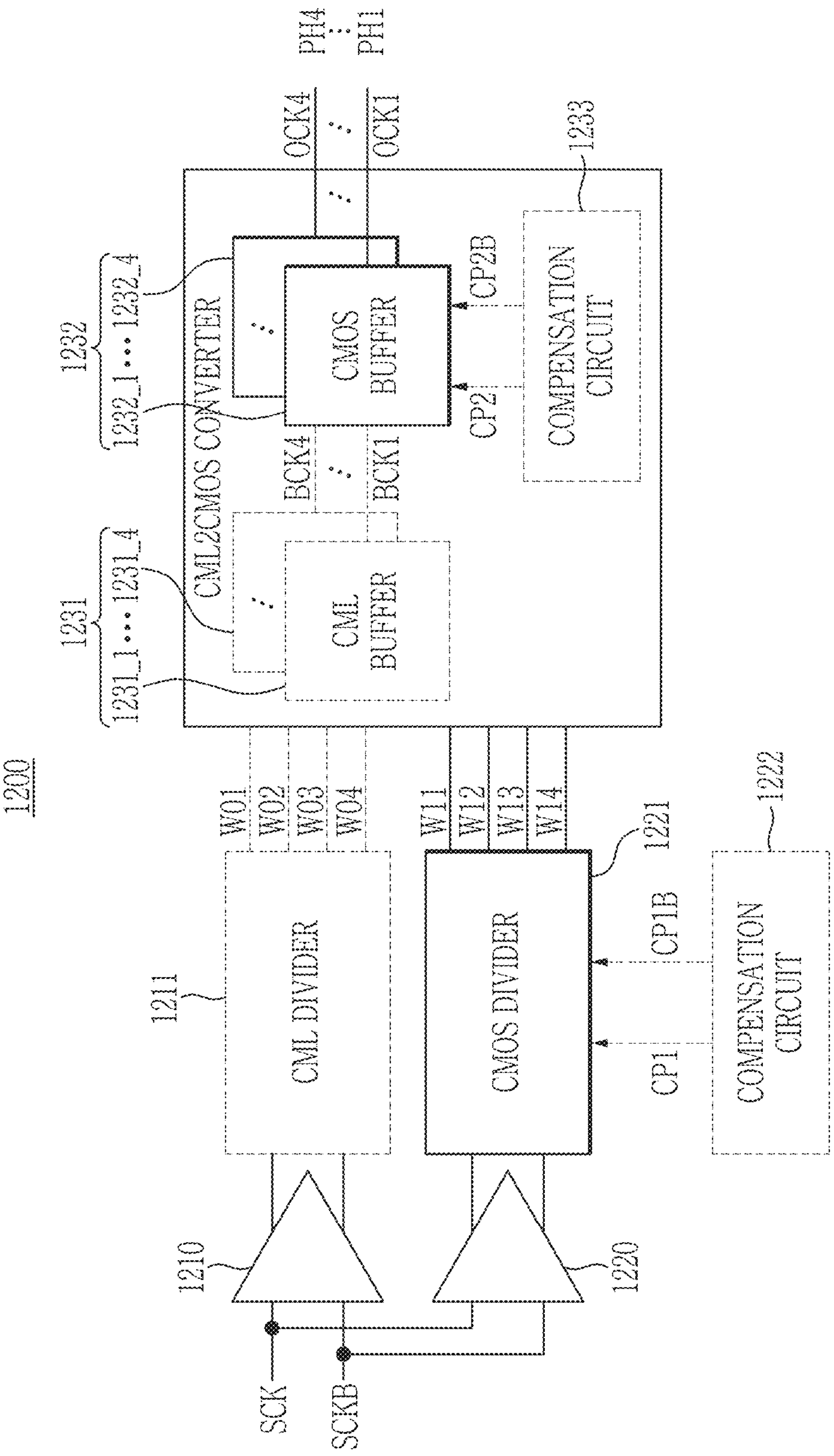
FIG. 12 is a view showing a phase splitter that outputs a clock signal during an offset calibration period of a sense amplifier according to another embodiment.

FIG. 12 is a view showing a phase splitter that outputs a clock signal during an offset calibration period of a sense amplifier according to another embodiment.

Referring to FIG. 12, the input terminal of the buffer 1220 may be input with internal clock signals SCK and SCKB. The internal clock signals SCK and SCKB may have opposite phases. Then, the output signal of buffer 1220 may be provided to the second divider 1221 to be divided and subsequently output as the offset clock signals OCK1, . . . , OCK4. Among the offset clock signal OCK1, . . . , OCK4, the offset clock signal pairs OCK1, OCK3/OCK2, OCK4 having the opposite phases may be applied to the clock input terminals PH1, PH3/PH2, and PH4 of the sampler circuit. According to this embodiment, the offset clock signals OCK1, OCK3/OCK2, and OCK4 of opposite phases may be provided by using the signal path of the phase splitter 1200 connected to each other to provide the divided clock signals DCK1 and DCK3. Features 1200, 1210, 1211, 1222, 1231 (e.g., 1231_1 . . . 1231_4), 1232 (e.g., 1232_1 . . . 1232_4), and 1233 are the same as or similar to those of 900, 910, 911, 922, 931 (e.g., 931_1 . . . 931_4), 932 (e.g., 932_1 . . . 932_4), and 933 of FIG. 9 and, thus, the description of these features will not be repeated.

Figure 13:
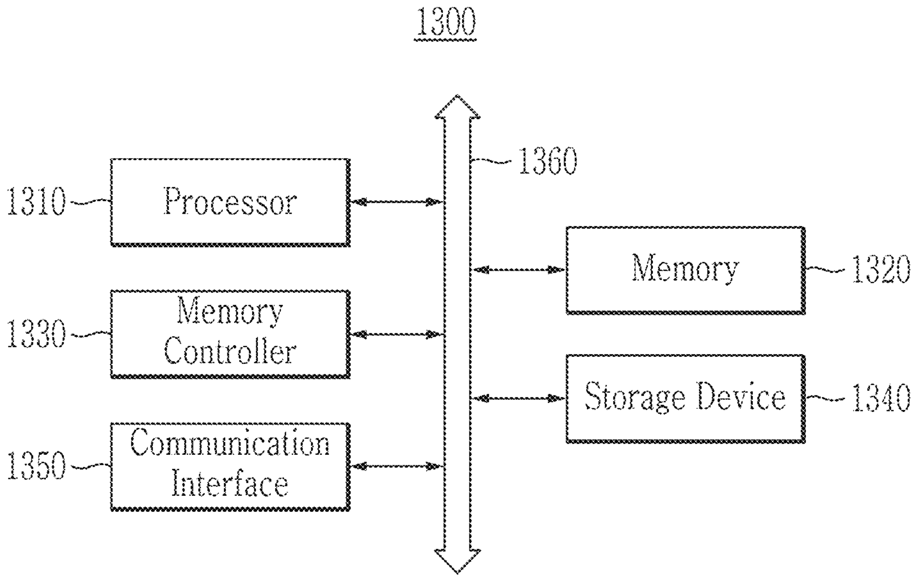
FIG. 13 is a block diagram showing a computer system according to an embodiment.

FIG. 13 is a block diagram showing a computer system according to an embodiment.

Referring to FIG. 13, a computing system 1300 includes a processor 1310, a memory 1320, a memory controller 1330, a storage device 1340, a communication interface 1350, and a bus 1360. The computing system 1300 may further include other general-purpose constituent elements.

The processor 1310 controls the overall operation of each component of the computing system 1300. The processor 1310 may be implemented as at least one of various processing units such as a central processing unit (CPU), an application processor (AP), and a graphics processing unit (GPU).

The memory 1320 stores various data and instructions. The memory 1320 may be implemented with the memory device described with reference to FIG. 1 to FIG. 12. The memory controller 1330 controls the transfer of the data or instructions to and from the memory 1320. The memory controller 1330 may be implemented with the memory controller described with reference to FIG. 1 to FIG. 12. In some embodiments, the memory controller 1330 may be provided as a chip separate from the processor 1310. In some embodiments, the memory controller 1330 may be provided as an internal configuration of the processor 1310.

The storage device 1340 stores programs and data non-temporarily. In some embodiments, the storage device 1340 may be implemented as a non-volatile memory. The communication interface 1350 supports wired/wireless Internet communication of the computing system 1300. In addition, the communication interface 1350 may support various communication methods other than Internet communication. The bus 1360 provides a communication function between constituent elements of the computing system 1300. The bus 1360 may include at least one type of bus according to a communication protocol between constituent elements.

In some embodiments, each constituent element or the combination of two or more constituent elements described with reference to FIG. 1 to FIG. 12 may be implemented as a digital circuit, a programmable or non-programmable logic device or array, an application specific integrated circuit (ASIC), and the like.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A memory system comprising:

a memory controller configured to transmit a data signal and a data clock signal in synchronization with the data signal; and a memory device comprising:

a clock control circuit configured to divide the data clock signal to generate a plurality of divided clock signals, a plurality of sampler circuits configured to sample the data signal in synchronization with the plurality of divided clock signals;

a calibration circuit configured to provide a plurality of offset clock signals having an opposite phase to each other to the plurality of sampler circuits to perform offset calibration of the plurality of sampler circuits based on outputs of the plurality of sampler circuits generated in synchronization with the plurality of offset clock signals.

2. The memory system of claim 1, wherein:

the memory controller is further configured to transmit a system clock signal, the clock control circuit is further configured to buffer the system clock signal to be provided to the calibration circuit, and the calibration circuit is further configured to generate the plurality of offset clock signals based on the buffered system clock signal.

3. The memory system of claim 1, wherein:

the calibration circuit is further configured to generate an internal clock signal and apply the internal clock signal to the clock control circuit so that the clock control circuit outputs the plurality of offset clock signals.

4. The memory system of claim 3, wherein:

the memory controller is further configured to transmit a system clock signal, the clock control circuit is further configured to buffer the system clock signal to be provided to the calibration circuit, and the calibration circuit is further configured to receive the buffered system clock signal and provide the internal clock signal to the clock control circuit so that the clock control circuit divides the internal clock signal to generate the plurality of offset clock signals.

5. The memory system of claim 1, wherein the calibration circuit is further configured to sequentially perform offset calibration of a first sampler circuit among the plurality of sampler circuits and a second sampler circuit among the plurality of sampler circuits while applying a first offset clock signal among the plurality of offset clock signals to the first sampler circuit and a second offset clock signal among the plurality of offset clock signals having the opposite phase to the first offset clock signal to the second sampler circuit.

6. The memory system of claim 1, wherein:

for n sampler circuits, where n is a natural number, the plurality of offset clock signals have a phase difference of 360/n degrees, and the calibration circuit is further configured to sequentially perform the offset calibration for the plurality of sampler circuits in a phase difference order of each of the plurality of offset clock signals applied to each of the plurality of sampler circuits.

7. The memory system of claim 1, wherein the memory device further comprises:

a memory cell array including a plurality of memory cells; and a sense amplifier configured to write the sampled data signal to the plurality of memory cells.

8. An offset calibration method comprising:

applying a first offset clock signal among a plurality of offset clock signals to a first sampler circuit among a plurality of sampler circuits;

applying a second offset clock signal, among the plurality of offset clock signals, having an opposite phase to the first offset clock signal to a second sampler circuit among the plurality of sampler circuits, and generating a first offset adjustment signal for adjusting an offset of the first sampler circuit based on an output of the first sampler circuit that is output in response to the first offset clock signal.

9. The offset calibration method of claim 8, further comprising:

receiving a system clock signal;

buffering the system clock signal; and generating the plurality of offset clock signals based on the buffered system clock signal.

10. The offset calibration method of claim 8, further comprising:

receiving a data clock signal in synchronization with a data signal;

generating a plurality of divided clock signals by dividing the data clock signal; and sampling, by the plurality of sampler circuits, the data signal in response to each of the plurality of divided clock signals.

11. The offset calibration method of claim 8, further comprising:

generating a first internal clock signal and a second internal clock signal; and generating the first offset clock signal by buffering the first internal clock signal and the second offset clock signal by buffering the second internal clock signal.

12. The offset calibration method of claim 10, wherein each of the plurality of sampler circuits includes an amplifier, wherein the sampling the data signal comprises:

applying a voltage configured to adjust an offset of the amplifier of the first sampler circuit according to the first offset adjustment signal, amplifying and outputting, by the amplifier of the first sampler circuit, a voltage difference between the data signal and a reference signal.

13. The offset calibration method of claim 12, wherein the generating the first offset adjustment signal comprises:

generating the first offset adjustment signal when the first offset clock signal is applied to the amplifier of the first sampler circuit and the second offset clock signal is applied to the amplifier of the second sampler circuit.

14. The offset calibration method of claim 12, further comprising:

generating a second offset adjustment signal adjusting an offset of the amplifier of the second sampler circuit in a period from the first offset adjustment signal when the first offset clock signal is applied to the amplifier of the first sampler circuit and the second offset clock signal is applied to the amplifier of the second sampler circuit.

15. The offset calibration method of claim 8, further comprising:

applying a third offset clock signal among the plurality of offset clock signals to a third sampler circuit among a plurality of sampler circuits after generating the first offset adjustment signal; and generating a third offset adjustment signal for adjusting an offset of the third sampler circuit based on an output of the third sampler circuit that is output in response to the third offset clock signal, wherein a sum of a phase difference between the third offset clock signal and the first offset clock signal and a phase difference between the second offset clock signal and the third offset clock signal is 180 degrees.

16. The offset calibration method of claim 8, further comprising:

performing sequentially an offset calibration for the plurality of sampler circuits in a phase difference order of each of the plurality of offset clock signals applied to each of the plurality of sampler circuits, wherein for n sampler circuits, where n is a natural number, the plurality of offset clock signals have a phase difference of 360/n degrees.

17. A method for operating a semiconductor memory device comprising:

applying a plurality of offset clock signals having an opposite phase to each other to a plurality of sampler circuits;

performing offset calibration of the plurality of sampler circuits based on outputs of the plurality of sampler circuits generated in synchronization with the plurality of offset clock signals;

receiving a data clock signal;

dividing the data clock signal to generate a plurality of divided clock signals;

sampling a data signal in synchronization with the plurality of divided clock signals; and writing the sampled data signal to a plurality of memory cells.

18. The method of claim 17, further comprising:

receiving a system clock signal;

buffering the system clock signal, and generating the plurality of offset clock signals based on the buffered system clock signal.

19. The method of claim 17, wherein the performing offset calibration of the plurality of sampler circuits comprises:

performing offset calibration of a first sampler circuit among the plurality of sampler circuits while applying a first offset clock signal among the plurality of offset clock signals to the first sampler circuit and a second offset clock signal among the plurality of offset clock signals having the opposite phase to the first offset clock signal to a second sampler circuit; and performing offset calibration of the second sampler circuit among the plurality of sampler circuits while applying a first offset clock signal among the plurality of offset clock signals to the first sampler circuit a second offset clock signal among the plurality of offset clock signals having the opposite phase to the first offset clock signal to the second sampler circuit.

20. The method of claim 17, performing offset calibration of the plurality of sampler circuits comprises:

performing sequentially the offset calibration for the plurality of sampler circuits in a phase difference order of each of the plurality of offset clock signals applied to each of the plurality of sampler circuits, wherein for n sampler circuits, where n is a natural number, the plurality of offset clock signals have a phase difference of 360/n degrees.

* * * * *